US012422404B2

(12) United States Patent
Yang et al.

(10) Patent No.: US 12,422,404 B2
(45) Date of Patent: Sep. 23, 2025

(54) TECHNOLOGIES FOR PARTICLE MANIPULATION USING HARMONIC ACOUSTIC WAVES

(71) Applicant: Duke University, Durham, NC (US)

(72) Inventors: Shujie Yang, Somerville, MA (US); Tony Jun Huang, Durham, NC (US)

(73) Assignee: Duke University, Durham, NC (US)

( * ) Notice: Subject to any disclaimer, the term of this patent is extended or adjusted under 35 U.S.C. 154(b) by 334 days.

(21) Appl. No.: 18/120,679

(22) Filed: Mar. 13, 2023

(65) Prior Publication Data
US 2023/0296563 A1 Sep. 21, 2023

Related U.S. Application Data

(60) Provisional application No. 63/321,241, filed on Mar. 18, 2022, provisional application No. 63/321,296, filed on Mar. 18, 2022.

(51) Int. Cl.
*G01N 29/02* (2006.01)
*G01N 29/036* (2006.01)
(Continued)

(52) U.S. Cl.
CPC ......... *G01N 29/022* (2013.01); *G01N 29/036* (2013.01); *G01N 29/2437* (2013.01); *H03H 9/02559* (2013.01); *G01N 2291/0423* (2013.01)

(58) Field of Classification Search
CPC ............... G01N 29/022; G01N 29/036; G01N 29/2437; G01N 2291/0423;
(Continued)

(56) References Cited

U.S. PATENT DOCUMENTS 9,606,086 B2    3/2017   Ding et al.
9,821,310 B2   11/2017   Guldiken et al.
(Continued)

FOREIGN PATENT DOCUMENTS

EP           2664916 B1    2/2017
WO   WO2021115046 A1   6/2021

OTHER PUBLICATIONS

Business Research Insights, "Colloids (Blood Plasma) Market Size, Share, Growth, And Industry Analysis by Type (Starches, Gelatins, Dextrans, Human Albumin & Other) by Application (Extensive Burns, Massive Blood or Plasma Loss, Hypovolemic Shock & Other), Regional Insights and Forecast from 2025 to 2033—Summary", accessed at https://straitsresearch.com/report/colloids-blood-plasma-market on Jun. 2, 2025, 4 pages.
(Continued)

*Primary Examiner* — Francis C Gray
(74) *Attorney, Agent, or Firm* — Barnes & Thornburg LLP

(57) ABSTRACT

Technologies for harmonic acoustic manipulation of colloidal particles include a system having a piezoelectric substrate coupled to one or more segmented acoustic transducers and a fluid positioned above the substrate. The segmented transducers have multiple segments, each with a resonant frequency equal to a harmonic frequency. The system further includes a controller that generates a harmonic signal including multiple harmonic components and applies the signal to the segmented acoustic transducers to generate an acoustic potential field in the fluid and manipulate the colloidal particles. The system may translate or rotate the particles, and may form the particles into a colloidal crystal monolayer. The system may selectively pair or otherwise group and separate individual particles. The system may pair and separate multiple groups of particles. The system may measure adhesion between particles. The
(Continued)

system may pattern particles over a surface. The colloidal particles may be cells.

20 Claims, 11 Drawing Sheets

(51) Int. Cl.
*G01N 29/24* (2006.01)
*H03H 9/02* (2006.01)
(58) Field of Classification Search
CPC ....... G01N 2291/02827; G01N 29/346; G01N 29/348; G01N 29/42; G01N 29/341; G01N 2291/02475; G01N 2291/106; H03H 9/02559
See application file for complete search history.

(56) References Cited

U.S. PATENT DOCUMENTS

| | | | |
|---|---|---|---|
| 10,106,397 B1 | 10/2018 | Kim et al. | |
| 2004/0072208 A1* | 4/2004 | Warthoe | G01N 29/022 |
| | | | 205/777.5 |
| 2010/0181869 A1* | 7/2010 | Pereira da Cunha | |
| | | | H03H 9/14541 |
| | | | 310/313 R |
| 2013/0192958 A1* | 8/2013 | Ding | B07C 5/3427 |
| | | | 198/630 |
| 2013/0330247 A1* | 12/2013 | Wilson | G01N 1/286 |
| | | | 422/504 |
| 2019/0031999 A1* | 1/2019 | Suresh | C12M 23/16 |
| 2019/0160463 A1* | 5/2019 | Ai | B01L 3/00 |
| 2020/0276579 A1* | 9/2020 | Huang | B01F 33/3021 |
| 2022/0203359 A1* | 6/2022 | Chiou | B01L 3/50273 |
| 2023/0051277 A1* | 2/2023 | Zhang | B06B 1/0607 |

OTHER PUBLICATIONS

Caleap et al., "Acoustically trapped colloidal crystals that are reconfigurable in real time", PNAS vol. 111, No. 17 (Apr. 29, 2014): 6226-6230.
Debrashree Bora, "Colloids (Blood Plasma) Market Size, Share & Trends Analysis Report By Type (Natural Type Colloids, Synthetic Type Colloids), By Applications (Extensive Burns, Massive Blood or Plasma Loss, Hypovolemic Shock, Others) and by Region (North America, Europe, APAC, Middle East and Africa, LATAM) Forecasts, 2025-2033—Report Overview", accessed at https://www.businessresearchinsights.com/market-reports/colloids-blood-plasma-market-102780# :~: text=COLLOIDS%20%28BLOOD%20PLASMA%29%20MARKET%20REPORT,9.08%25%20during.
Dillekis et al., "Are 90% of deaths from cancer caused by metastases?" Cancer Medicine 2019;8: 5574-5576.
Duke University, "Overview of Acoustofluidics", accessed at https://acoustofluidics.pratt.duke.edu/research/overview-acoustofluidics on May 29, 2025, 18 pages.
EIN Press Wire, "Colloidal Metal Particles Market is forecast to reach a valuation of US$ 32.3 Bn by 2028: Colloidal Metal Particles Market—Analysis, Outlook, Growth Trends, and Forecast" Mar. 1, 2022, accessed at https://www.einnews.com/pr_news/564368563/colloidal-metal-particles-market-is-forecast-to-reach-a-valuation-of-US-32-3-bn-by-2028 on May 29, 2025, 4 pages.
Food and Drug Administration, "How to Determine if your Product is a Medical Device", accessed at https://www.fda.gov/medical-devices/classify-your-medical-device/how-determine-if-your-product-medical-device on May 29, 2025, 6 pages.
Grand View Research, "Organoids And Spheroids Market Size, Share & Trends Analysis Report By Type, By Application (Developmental Biology, Personalized Medicine, Regenerative Medicine), By End Use, By Region And Segment Forecasts, 2025-2030" accessed at https://www.grandviewresearch.com/industry-analysis/organoids-spheroids-market# on May 29, 2025, 13 pages.
Grand View Research, "Tissue Engineering Market Size, Share & Trends Analysis Report By Application (Cord Blood & Cell Banking, Cancer, GI & Gynecology, Dental, Orthopedics, Musculoskeletal, & Spine, Urology), By Region And Segment Forecasts, 2025-2030", accessed at https://www.grandviewresearch.com/industry-analysis/tissue-engineering-and-regeneration-industry#:~: text=The%20global%20tissue%20engineering%20market, has%20boosted%20the%20market%20growth on May 29, 2025, 8 pages.
Lab On a Chip Market, "Global Lab On a Chip Market Size, Share, Trends & Growth Forecast Report By Product Type, Technology and Region (North America, Europe, Asia-Pacific, Latin America, Middle East and Africa), Industry Analysis From 2025 to 2033", accessed at https://www.researchandmarkets.com/reports/4313303/global-lab-on-a-chip-market-size-market-share on May 29, 2025, 6 pages.
Li et al., "Acoustic separation of circulating tumor cells", PNAS vol. 112, No. 16 (Apr. 21, 2015), 4970-4975.
Li et al., "Acoustic tweezer with complex boundary-free trapping and transport channel controlled by shadow waveguides", Sci. Adv. 2021;7 : eabi5502 Aug. 18, 2021, 6 pages.
Li et al., "Acoustofluidic bacteria separation", J Michomech Microeng. Jan. 1, 2017; 27(1). doi:10.1088/1361-6439/27/1/015031, 15 pages.
National Cancer Institute, Cancer Statistics, accessed at https://www.cancer.gov/about-cancer/understanding/statistics on May 29, 2025, 4 pages.
Ozcelik, "Acoustic tweezers for the life sciences", Nat Methods Dec. 2018; 15(12): 1021-1028.
Shi et al., Continuous Particle Separation in a Microfluidic Channel via Standing Surface Acoustic Waves (SSAW), Lab on a Chip, vol. 9, pp. 3354-3359, 2009.
Shi et al., Focusing Microparticles in a Microfluidic Channel with Standing Surface Acoustic Waves (SSAW), Lab on a Chip, vol. 8, pp. 221-223, 2008.
Sitters, et al., "Acoustic force spectroscopy," Nature Methods 12, 47-50 (2015), 8 pages.
Tian et al., "Wave No. spiral acoustic tweezers for dynamic and reconfigurable manipulation of particles and cells", Sci. Adv. 2019;5:eaau6062 May 31, 2019, 9 pages.
Yang et al., "Self-Navigated 3D Acoustic Tweezers in Complex Media Based on Time Reversal", Research, vol. 2021, Article ID 9781394, 13 pages.
Yang, S., Tian, Z., Wang, Z. et al. Harmonic acoustics for dynamic and selective particle manipulation. Nat. Mater. 21 (2022): 540-546.

\* cited by examiner

TECHNOLOGIES FOR PARTICLE MANIPULATION USING HARMONIC ACOUSTIC WAVES

CROSS-REFERENCE TO RELATED APPLICATIONS

This application claims the benefit of and priority to U.S. Patent Application No. 63/321,241, entitled "SYSTEMS AND METHODS FOR PARTICLE MANIPULATION USING HARMONIC ACOUSTIC WAVES," which was filed on Mar. 18, 2022, and to U.S. Patent Application No. 63/321,296, entitled "SYSTEMS AND METHODS FOR PARTICLE MANIPULATION USING HARMONIC ACOUSTIC WAVES," which was filed on Mar. 18, 2022, each of which is incorporated herein by reference in its entirety.

STATEMENT REGARDING FEDERALLY SPONSORED RESEARCH

This invention was made with Government support under Federal Grant Nos. R01GM141055, R01GM132603, U18TR003778, and UH3TR002978, awarded by the National Institutes of Health, and under Federal Grant Nos. ECCS-1807601 and CMMI-2104295 awarded by the National Science Foundation. The Government has certain rights in this invention.

BACKGROUND

The ability to assemble colloidal particles with well-controlled shapes and material properties has been studied as an excellent model for exploring how matter organizes in materials science, condensed-matter physics and biophysics. Unlike nanoparticles, microscale particles cannot easily self-assemble into high-quality crystals. To direct the colloidal assembly of microscale particles, various methods including the use of specific surface functionalities, such as DNA linkers and attractive "patches," different liquid solvents, complex anisotropic particles, or the modification of colloids using phototactic, electric and magnetic mechanisms, have been reported. Typical approaches may have synthetic difficulties associated with specific colloidal shapes or materials, poor control and tunability of interactions, and may be difficult to generalize. Additionally, these colloid manipulation approaches may not be directly applied to cell manipulation applications to understand cell-cell interactions or build ordered biological structures.

Acoustic tweezers, which are the acoustic analogue of optical tweezers, eliminate the need for optical tables, high-powered lasers, and complicated and time-consuming optical alignment, and offer a contact-free, highly biocompatible approach for performing particle manipulation. However, current standing wave-based acoustic tweezers and the recently developed acoustic force spectroscopy method can only trap and manipulate particles as a group, limiting their ability to control individual particles for precise colloidal assembly selectively. To overcome this limitation, phased array transducers and acoustic hologram methods have been developed to manipulate millimeter-scale particles individually.

SUMMARY

According to one aspect of the disclosure, a method for harmonic acoustic manipulation of particles comprises introducing particles into a fluid positioned over a first surface of a piezoelectric substrate; generating a first harmonic signal comprising a plurality of harmonic components; and applying the first harmonic signal to a first harmonic acoustic transducer, wherein the first harmonic acoustic transducer is coupled to the first surface of the piezoelectric substrate and spaced apart from the fluid. In an embodiment, the particles are cells, colloids, extracellular vesicles, or particles with a corresponding diameter between 1 nm and 1 cm.

In an embodiment, the method further comprises varying a parameter of one or more harmonic components of the plurality of harmonic components after introducing the particles into the fluid. In an embodiment, the parameter comprises a frequency, an amplitude, or a phase. In an embodiment, the method further comprises manipulating a single particle or a group of particles within the fluid by varying the parameter of the one or more harmonic components.

In an embodiment, manipulating the particles comprises translating a particle or a group of particles. In an embodiment, manipulating the particles further comprises rotating a particle or a group of particles. In an embodiment, manipulating the particles further comprises causing a plurality of particles to combine by reducing a distance between a corresponding acoustic trapping wells generated by the first harmonic signal. In an embodiment, manipulating the particles further comprises causing the plurality of particles to separate by increasing the distance between the corresponding pair of acoustic trapping wells generated by the first harmonic signal. In an embodiment, manipulating the particles further comprises measuring adhesion strength of a plurality of particles. In an embodiment, manipulating the particles further comprises c selectively manipulating target particles while keeping other particles intact. In an embodiment, manipulating the particles further comprises reducing a distance between a plurality of acoustic trapping wells generated by the first harmonic signal.

In an embodiment, applying the first harmonic signal comprises applying the signal with time-division multiplexing. In an embodiment, time-division multiplexing comprises, for each time division of the first harmonic signal, applying a signal with an excitation frequency corresponding to a resonant frequency of a segment of the first harmonic acoustic transducer.

In an embodiment, the piezoelectric substrate comprises lithium niobate, lithium tantalite, gallium arsenide, aluminum nitride, zinc oxide, lead zirconate titanate, or quartz. In an embodiment, the first harmonic signal has a fundamental frequency between 20 KHz and 10 GHz.

According to another aspect, a system for harmonic acoustic manipulation comprises a piezoelectric substrate having a first surface, and a segmented acoustic transducer coupled to the first surface of the piezoelectric substrate. The segmented acoustic transducer comprises a plurality of segments including a first segment and a second segment. The first segment has a first resonant frequency and the second segment has a second resonant frequency, wherein the second resonant frequency is an integer multiple of the first resonant frequency.

In an embodiment, each segment of the plurality of segments comprises a plurality of interdigital fingers separated by a finger pitch distance, wherein the first segment has a first finger pitch distance and the second segment has a second finger pitch distance, wherein the first finger pitch distance is the integer multiple of the second finger pitch distance. In an embodiment, the first finger pitch distance is twice the second finger pitch distance; and the second resonant frequency is twice the first resonant frequency.

In an embodiment, the system further comprises a first pair of segmented acoustic transducers coupled to the first surface of the piezoelectric substrate, the first pair including the segmented acoustic transducer; and a second pair of segmented acoustic transducers orthogonal coupled to the first surface of the piezoelectric substrate and orthogonal to the first pair.

In an embodiment, the system further comprises a controller configured to generate a first harmonic signal comprising a plurality of harmonic components, wherein each of the harmonic components has a frequency that corresponds to the resonant frequency of a segment of the segmented acoustic transducer; and apply the first harmonic signal to the segmented acoustic transducer.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
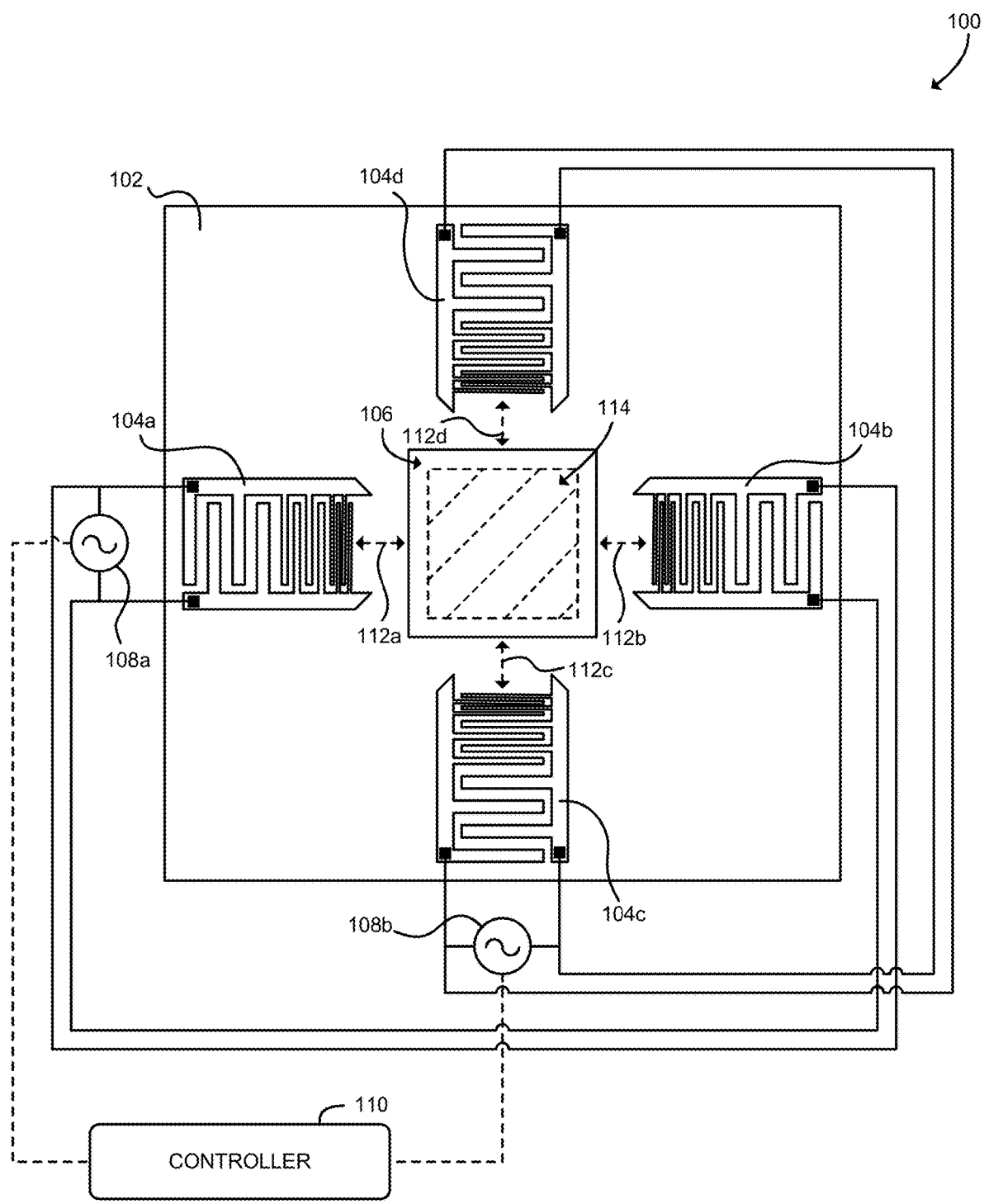
FIG. 1 is a schematic view of at least one embodiment of a system for harmonic acoustic particle manipulation.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); or (A, B, and C). Similarly, items listed in the form of "at least one of A, B, or C" can mean (A); (B); (C): (A and B); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 3:
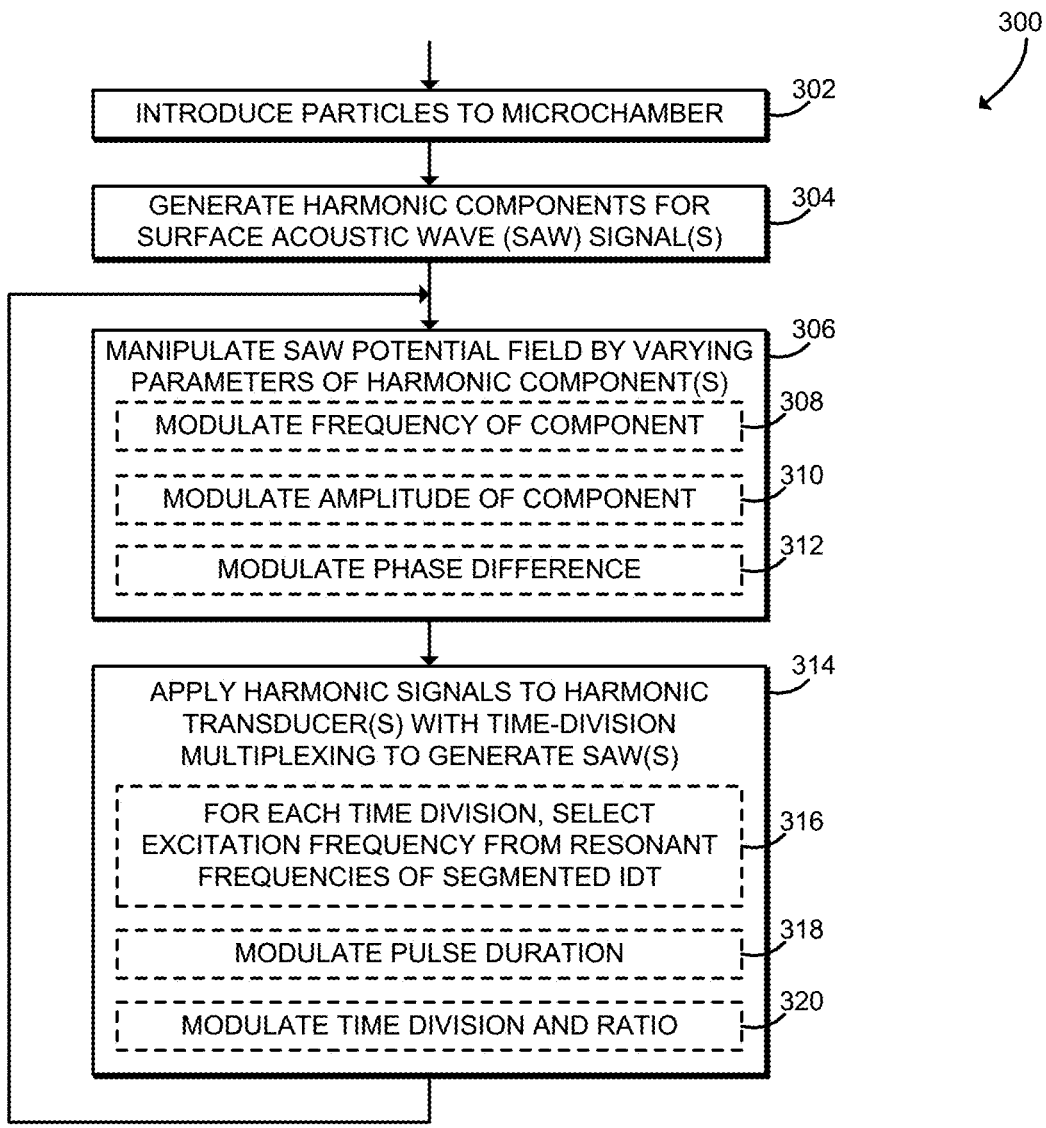
FIG. 3 is a simplified flow diagram of at least one embodiment of a method for dynamically manipulating particles with harmonic acoustic waves that may be executed with the system of FIGS. 1-2.

Referring now to FIG. 1, an illustrative system 100 for harmonic acoustic particle manipulation includes a piezoelectric substrate 102 coupled to multiple segmented harmonic interdigital transducers 104. One potential embodiment of such a segmented transducer 104 is shown in FIG. 3 and further described below. A fluid layer 106 is positioned over the substrate 102 and between the transducers 104. In use, and as described further below, a fluid including microscale particles such as cells or colloids is introduced to the fluid layer 106, and one or more harmonic signals are applied to the transducers 104. As described further below, those harmonic signals include multiple harmonic components, and the frequency of each harmonic corresponds to a resonant frequency of a particular segment of the segmented transducers 104. The transducers 104 generate surface acoustic waves in the piezoelectric substrate 102, which propagate underneath the fluid layer 106. The surface acoustic waves couple with the fluid layer 106 and generate an acoustic potential field within the fluid layer 106. The acoustic potential exerts gentle actuation forces on the particles suspended in the fluid layer 106. Varying parameters of the harmonic signals allows for dexterous manipulation of the particles, without causing damage to fragile or soft particles such as cells or colloids. For example, the system 100 is capable of performing manipulations such as generating colloidal crystal monolayers or soft condensed matter, selectively pairing and separating single colloids, high-throughput pairing and separation of many pairs of colloids, high-throughput measurement of adhesion between colloids, patterning surfaces with colloids, and other manipulations.

One aspect of the present disclosure provides systems and methods using harmonic acoustics for non-contact, dynamic, and selective particle manipulation. Time-effective Fourier-synthesized harmonics are used to achieve such manipulation for the generation of reconfigurable acoustic lattices and spatial control of particles and cells suspended in liquid. The system 100 described herein can produce formation, reconfiguration, and precise rotational control of colloidal crystals or soft condensed matter. It can also actively control the lattice constant by the frequency or amplitude modulation of multi-harmonic waves to pair two target cells selectively with tunable inter-cellular distances or collectively manipulate an array of colloidal clusters or cells. It can control cells with more than 100 pairs in a suspension for reversible pairing and separation in a high-throughput, precise, programmable, and repeatable (>1,000 cycles) manner, all of which are improvements over existing colloid assembly or single-cell manipulation methods. With its soft yet powerful, precise yet high-throughput particle manipulation mechanism, the system 100 described herein provides a practical solution to provide deeper insights into intercellular adhesion forces, predict cancer metastasis, and establish a platform for personalized medicine via precision 3D biomaterial synthesis for organoid engineering.

Additionally, in comparison to existing techniques, the system 100 provides a more versatile method that can precisely manipulate both colloid materials and cells, without any surface treatment or modification of the particles' material properties, into desired formations. Further, the system 100 can be used to select single cells (roughly 10 μm diameter) or micrometer-scale colloidal particles, which may not be possible for typical systems due to their millimeter-level spatial resolution. Additionally, the system 100 provides precise assembly of colloidal matter and reversible cell-cell pairing and separation as compared to typical systems, which require either adjusting the phase or moving the transducer, and may have difficulty with precise assembly of colloidal matter and with reversible cell—cell pairing and separation due to the steady-state nature of the acoustic wavefield and/or the imprecision of acoustic streaming or vortex generation.

In the illustrated embodiment shown in FIG. 1, the system 100 includes the piezoelectric substrate 102, which is illustratively formed from a single-crystal piezoelectric material. Illustratively, the substrate 102 is formed from 128° Y-cut lithium niobite (LiNbO$_3$). In other embodiment, the substrate 102 may be formed from any other appropriate piezoelectric material, including but not limited to lithium tantalite, gallium arsenide, aluminium nitride, zinc oxide, lead zirconate titanate, quartz, or other materials with piezoelectric properties. The fluid layer 106 is formed on the piezoelectric substrate 102. The fluid layer 106 may be embodied as a liquid droplet, a fluid contained in a confined channel such as a microchamber, or other fluid layer positioned on the piezoelectric substrate 102. Illustratively, the fluid layer 106 is contained in a microchamber formed from polydimethylsiloxane (PDMS) using soft lithography techniques. The illustrative microchamber has dimensions of 400×400×20 μm$^3$, however in other embodiments the fluid layer 106 may have other micro-scale dimensions.

As shown, the system 100 includes four segmented interdigital transducers (IDTs) 104a through 104d. In particular, the system 100 includes a pair of opposed segmented IDTs 104a, 104b and another pair of opposed segmented IDTs 104c, 104d that are positioned orthogonal to the segmented IDTs 104, 104b. The illustrative segmented IDTs 104 may be formed through photolithographic deposition of interdigital electrodes on the substrate 102. As described further below, application of a harmonic electrical signal to each segmented IDT 104 generates surface acoustic waves in the piezoelectric substrate 102 through the piezoelectric effect. Although illustrated as including four IDTs 104a through 104d, it should be understood that in other embodiments the system 100 may include a different number of segmented IDTs 104, such as a single segmented IDT 104 or two segmented IDTs 104. Each of the pairs of segmented IDTs 104a, 104b and 104c, 104d may operate as an acoustic transducer set, which is a collection of one or more acoustic transducers for generating acousto waves. Additionally, although the pairs of segmented IDTs 104a, 104b and 104c, 104d are illustrated as being orthogonal to each other, it should be understood that in other embodiments the segmented IDTs 104 may be positioned at a different angle relative to each other (e.g., between 0 and 179 degrees). Additionally or alternatively, although illustrated as segmented IDTs 104, it should be understood that in other embodiments, the system 100 may include any other acoustic transducer 104 capable of generating harmonic acoustic waves in the piezoelectric substrate 102.

Figure 2:
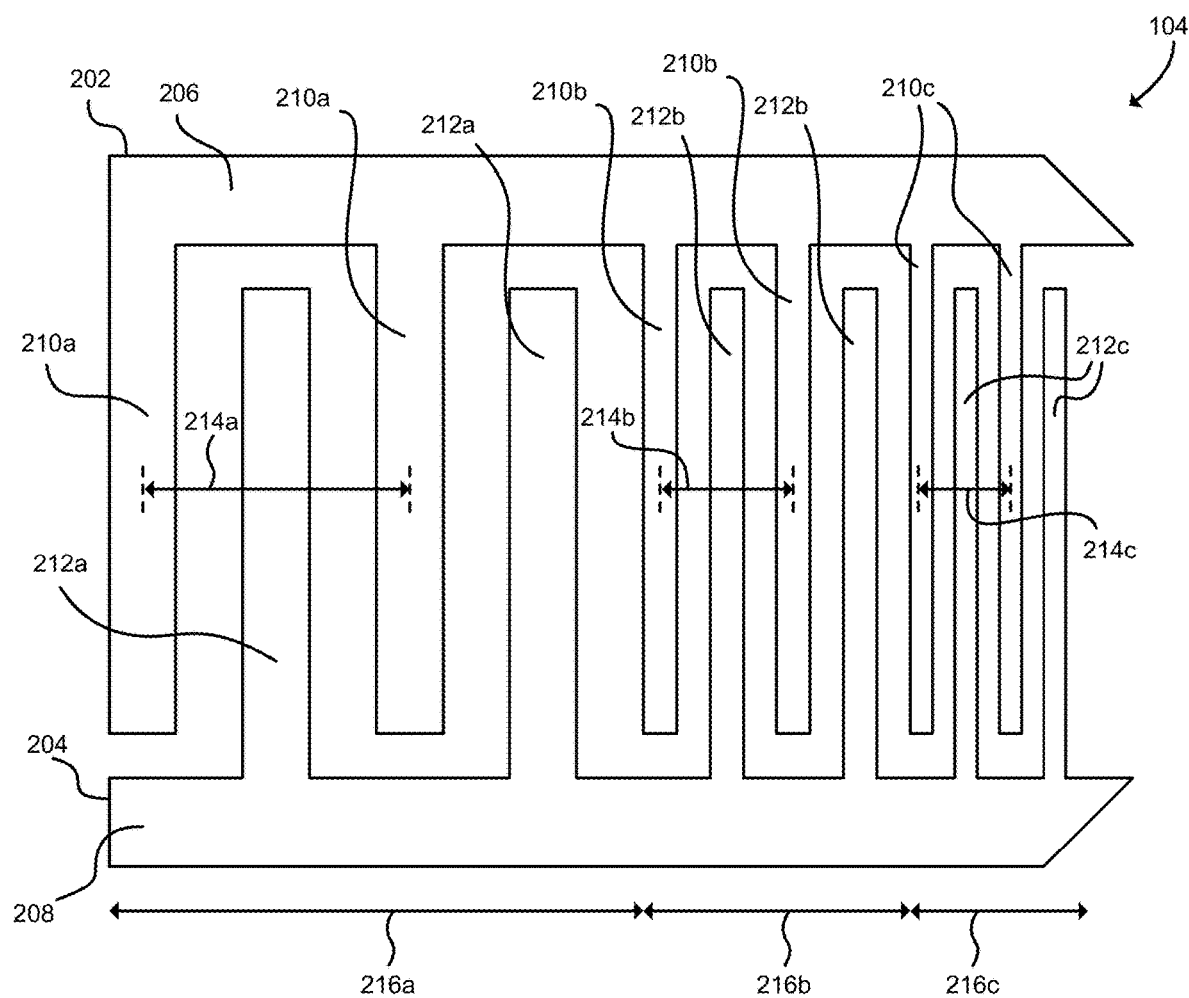
FIG. 2 is a schematic view of at least one embodiment of a segmented acoustic transducer of FIG. 1.

Referring now to FIG. 2, one illustrative embodiment of a segmented IDT 104 is shown. The illustrative segmented IDT 104 includes a pair of electrodes 202, 204, which in the illustrative embodiment are formed from a 10 nm chromium (Cr) adhesion layer and an 80 nm gold (Au) conductive layer deposited onto the substrate 102. As shown, each electrode 202, 204 includes a respective rail 206, 208 extending roughly parallel. Each electrode 202, 204 further includes respective interdigitated fingers 210, 212 extending toward the other electrode. More particularly, electrode 202 includes multiple fingers 210 extending roughly perpendicular from the rail 206 toward the rail 208 of the electrode 204. Similarly, electrode 204 includes multiple fingers 212 extending roughly perpendicularly from the rail 208 toward the rail 206 of the electrode 202. As shown, each finger 210, 212 is separated from the next corresponding finger 210, 212 by a pitch width 214 (shown only with respect to the electrode 202 to enhance clarity). As shown, except for fingers 210, 212 on the end of the IDT 104, each finger 210, 212 from a particular electrode 202, 204 is surrounded by fingers 210, 212 from the other electrode 202, 204. That is, except for the ends, each finger 210 is surrounded by a pair of fingers 212, and each finger 212 is surrounded by a pair of fingers 210.

As shown, the segmented IDT 104 further includes multiple segments 216. Illustratively, the IDT 104 includes three segments 216a, 216b, 216c. For each segment 216, the corresponding fingers 210, 212 are separated by a different pitch width 214. For example, in the segment 216a, the fingers 210a, 212a are separated by the pitch width 214a, in the segment 216b, the fingers 210b, 212b are separated by the pitch width 214b, and in the segment 216c, the fingers 210c, 212c are separated by the pitch width 214c. The pitch width 214 of each segment 216 may be determined as a base width (e.g., the widest pitch width 214a) divided by an integer associated with the segment (e.g., n=1, 2, . . . to N). For example, in the illustrative embodiment, the pitch width 214b is one-half of the pitch width 214a, and the pitch width 214c is one-third of the pitch width 214a. Conversely, each pitch width 214 may be determined as an integer multiple of the smallest pitch width 214 (e.g., the pitch width 214b is twice the pitch with 214c, and the pitch width 214a is three times the pitch width 214c). The base pitch width 214a may be determined based on the wavelength of SAWs in the substrate 102, for example as one-quarter wavelength of a standing wave in the substrate 102. Although illustrated as including three segments 216a, 216b, 216c, it should be understood that in some embodiments, the segmented IDT 104 may include a different number of segments 216, such as six segments 216, eight segments 216, or another number of segments 216. Further, although the illustrative segmented IDT 104 includes the same number of fingers 210, 212 in each segment 216, in some embodiments the segments 216 may have varying numbers of fingers 210, 212.

Accordingly, the segmented transducer 104 as shown in FIG. 2 is capable of generating multi-harmonic surface acoustic waves (SAWs). In particular, each individual segment 216 provides a distinct passband with wavenumbers $[k_n]_N$ at the resonant frequencies $[f_n]_N$, where N is the total number of segments 216. Further, the intensity response of each harmonic component can be individually controlled with the modulation of electrode finger-pair 210, 212 numbers. Specifically, the response intensity can be strengthened for particular components by simply increasing the corresponding finger-pair 210, 212 numbers.

Referring again to FIG. 1, each of the IDTs 104 is coupled to a signal source 108, which may be embodied as a function generator, an oscillator, an amplifier, a variable-frequency signal generator, a digital-to-analog (D/A) converter, or any other signal source capable of generating a varying electrical signal. Illustratively, a signal source 108a is coupled to the pair of IDTs 104a, 104b, and another signal source 108b is coupled to the pair of IDTs 104c, 104d. In the illustrative embodiment, the electrodes of each pair of IDTs 104a, 104b and 104c, 104d are coupled to the respective signal sources 108a, 108b such that electrodes of the same polarity relative to the signal source 108 are positioned opposite each other (i.e., connected in a cis-configuration). In some embodiments, the electrodes of each pair of IDTs 104a, 104b and 104c, 104d are coupled to the respective signal sources 108a, 108b in a trans-configuration; that is, the polarity of the respective signal source 108a, 108b may be reversed between the pairs of IDTs 104a, 104b and 104c, 104d.

The signal sources 108 are coupled to a controller 110, which may be embodied as a microcontroller, a digital signal processor, a programmable logic unit, a computer, or any other control circuit capable of controlling operations of the signal sources 108. For example, the controller 110 may be capable of controlling one or more parameters of each signal source 108, such as amplitude (i.e., voltage), frequency, phase, on/off time, or other parameters. To do so, the controller 110 may include a number of electronic components commonly associated with units utilized in the control of electronic and electromechanical systems. For example, the controller 110 may include, amongst other components customarily included in such devices, a processor and a memory device. The processor may be any type of device capable of executing software or firmware, such as a microcontroller, microprocessor, digital signal processor, or the like. The memory device may be embodied as one or more non-transitory, machine-readable media. The memory device is provided to store, amongst other things, instructions in the form of, for example, a software routine (or routines) which, when executed by the processor, allows the controller 110 to dynamically control parameters of the signal sources 108 using the other components of the system 100. In some embodiments, the controller 110 may also include an analog interface circuit, which may be embodied as any electrical circuit(s), component, or collection of components capable of performing the functions described herein. The analog interface circuit may, for example, convert signals from the processor into output signals which are suitable for controlling the signal sources 108. It is contemplated that, in some embodiments, the signal sources 108 (or portions thereof) may be integrated into the controller 110.

In use, the electrical signals applied by the sources 108 to the IDTs 104 generate acoustic waves 112 that propagate through the piezoelectric substrate 102. Illustratively, the opposing IDTs 104a, 104b generate opposing acoustic waves 112a, 112b, and similarly, the opposing IDTs 104c, 104d generate opposing acoustic waves 112c, 112d. The acoustic waves 112a, 112b are orthogonal to the acoustic waves 112c, 112d. As described further below, the acoustic waves 112 superimpose and otherwise interact to generate an acoustic potential field 114 within the fluid layer 106.

In some embodiments, manipulation of particles within the fluid layer 106 may be monitored using an inverted microscope. The microscope image may be focused onto a camera (e.g., a CMOS sensor device) or other imaging sensor for video and/or still image recording. In some embodiments, a polarize chip may be used to eliminate double images caused by reflections from the substrate 102 surface.

Referring now to FIG. 3, in use, the system 100 may execute a method 300 for dynamically manipulating particles with harmonic acoustic waves. It should be appreciated that, in some embodiments, one or more operations of the method 300 may be performed by the controller 110 and/or by other components of the system 100 as shown in FIG. 1. The method 300 beings with block 302, in which particles are introduced to the fluid layer 106 of the system 100. The particles may be embodied as micro-scale particles or colloids suspended in a fluid medium. For example, the particles may include cells such as cancer cells, human cells, mouse cells, extracellular vesicles, or other biological colloidal particles. The particles may have a micro-scale size, for example an average diameter of about 10 µm, or about 2 µm, or between 5 µm and 15 µm, or between 1 µm and 20 µm, or between 1 µm and 1,000 µm, or between 1 nm and 1 cm.

In block 304, the controller 110 generates multiple harmonic components for one or more surface acoustic wave (SAW) signals. The controller 110 may, for example, generate a Fourier-synthesized harmonic signal based on a predetermined number of harmonic frequencies. The controller 110 may generate six, eight, or a different number of harmonic components. As described above, each of those harmonic components may have a harmonic frequency that corresponds to the resonant frequency or otherwise matches a passband of a segment 216 of the segmented IDT 104. The controller 110 may generate a single harmonic signal, for example for one-dimensional manipulation by a single IDT 104 or a single set of opposed IDTs 104, two harmonic signals for two corresponding orthogonal sets of opposed IDTs 104, or a different number of harmonic signals. When applied to the segmented IDT(s) 104, the harmonic signals generate an acoustic potential field within the fluid layer 106.

In block 306, the controller 110 manipulates the acoustic potential field by varying one or more parameters of one or more harmonic components of the harmonic signals. The acoustic potential field may define one or more acoustic wells, which are regions where the acoustic radiation force is at a minimum. These acoustic wells may function as a node for trapping objects. Additionally or alternatively, in some embodiments certain objects may be trapped at antinodes or other regions where acoustic radiation force is at a maximum. The controller 110 may vary parameters of the harmonic components in order to change the location, size, shape, or other properties of one or more acoustic wells defined in the acoustic potential field. In some embodiments, in block 308 the controller 110 may modulate the frequency of one or more harmonic components, including the fundamental frequency and subsequent harmonic frequencies. For example, in some embodiments, the fundamental frequency may be changed from about 40 MHz to about 38 MHz for one set of orthogonal transducers 104, which may change the shape of the acoustic wells. In some embodiments, in block 310 the controller 110 may modulate the amplitude of one or more harmonic components. For example, in some embodiments, the harmonic signal may have a fundamental frequency of 40 MHz and a second harmonic of 80 Mhz. The controller 110 may decrease the amplitude of the fundamental frequency and increase the amplitude of the second harmonic, which may reduce spacing between the acoustic wells. In some embodiments, in block 312 the controller 110 may modulate a phase difference of one or more harmonic components.

In block 314, the controller 110 applies the harmonic signals to the segmented transducers 104 with time-division multiplexing to generate SAWs in the substrate 102 and thereby the fluid layer 106. To perform the time-division multiplexing, the controller 110 may generate a signal at the particular harmonic frequency associated with each harmonic component for part of a small time division. Those time divisions may be small, for example on the order of nanoseconds. Thus, for micro-scale colloidal particles such as cells, the resultant acoustic waves are time-effective Fourier-synthesized harmonic SAWs. The controller 110 may, for example, cause a voltage source 108 to apply an electrical signal corresponding to the time-division multiplexed signal to the transducers 104. In some embodiments, in block 316, for each time division, the controller 110 selects an excitation frequency from the resonant frequencies of the segmented IDT 104. In some embodiments, in block 318 the controller 110 may modulate the pulse duration for each harmonic component. In some embodiments, in block 320 the controller 110 may modulate the time division and ratio of active times for each frequency component. After applying the harmonic signals to the transducers 104, the method 300 loops back to block 306, in which the controller 110 may continue to manipulate the acoustic potential field by varying parameters of the harmonic components.

Figure 4:
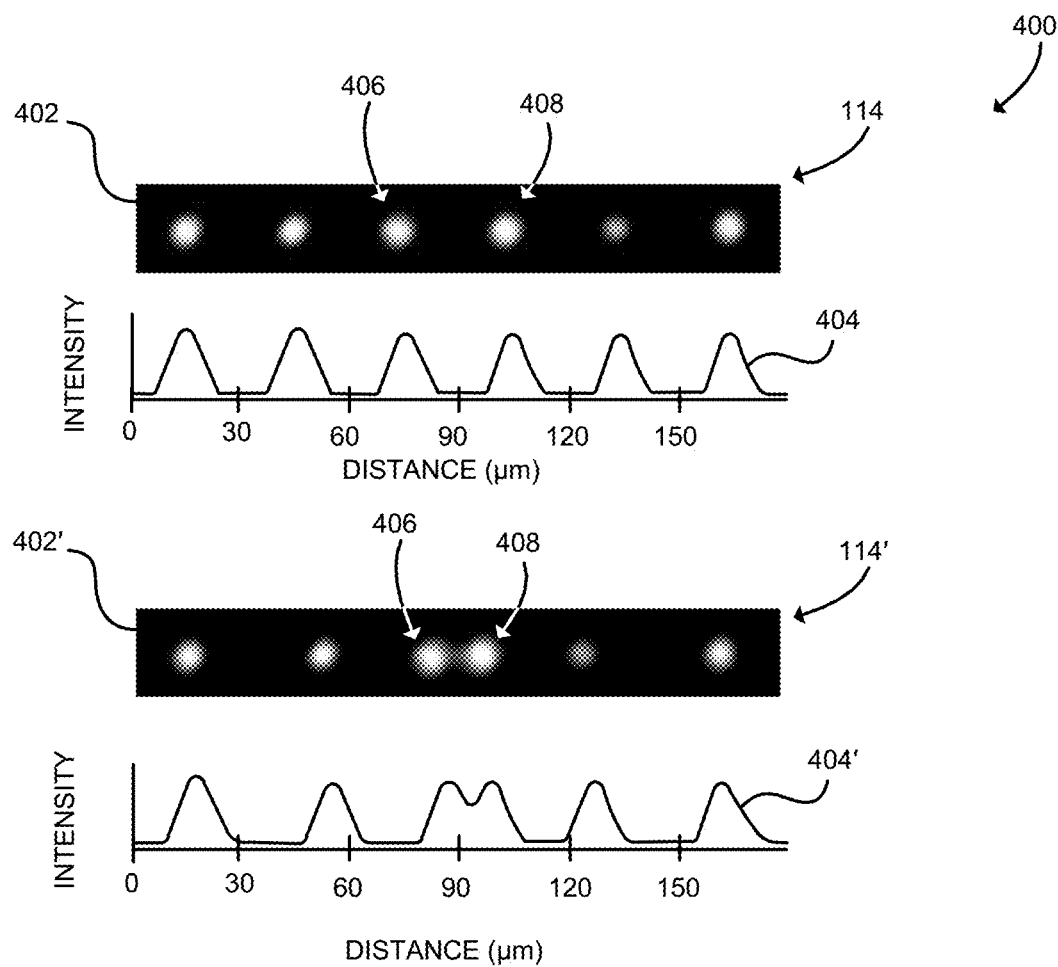
FIG. 4 is an illustration of experimental results that may be achieved for one-dimensional manipulation of particles using the system of FIGS. 1-2 and the method of FIG. 3.

Referring now to FIG. 4, diagram 400 shows illustrative experimental results for one-dimensional manipulation of particles that may be performed using the system 100. Image 402 shows particles that are trapped in acoustic wells defined in the acoustoelectric field 114. Illustratively, the particles are U937 cells. The image 402 is generated by fluorescent imaging and shows the fluorescent intensity profile averaged from five cell groups. Curve 404 illustrates the fluorescent intensity profile for the captured cells. As shown, a pair of cells 406, 408 are captured in acoustic wells separated by about 30 μm. As described above, parameters of the harmonic signals applied to the IDTs 104 may be varied in order to selectively change the position of acoustic wells in the acoustoelectric field 114. Image 402' shows the particles that are trapped in the acoustic wells defined in the modified acoustoelectric field 114'. Curve 404' shows the modified fluorescent intensity profile averaged from the five cell groups. As shown, as the acoustic wells are moved closer together, the cells 406, 408 have also been moved closer together, assembling a pair. Other cells in the other acoustic wells have not been moved. Accordingly, the system 100 is capable of selectively pairing cells and other colloidal particles at micrometer-scale resolution. Similarly, the system 100 is capable of selectively separating pairs of cells and other colloidal particles by modifying the acoustic potential field 114 in reverse. The system 100 is further capable of reversibly pairing and separating pairs of cells and other colloidal particles.

Figure 5:
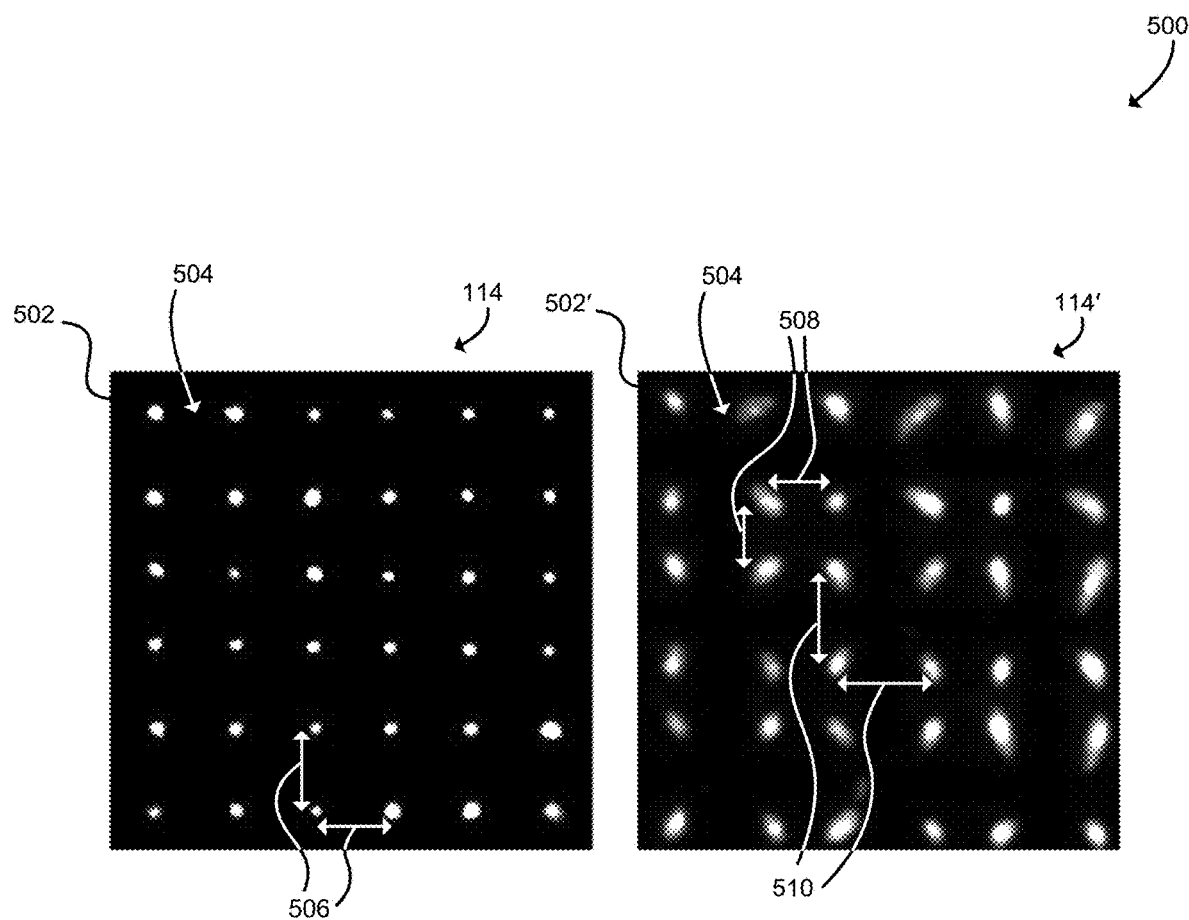
FIG. 5 is an illustration of experimental results that may be achieved for two-dimensional manipulation of particles using the system of FIGS. 1-2 and the method of FIG. 3.

Referring now to FIG. 5, diagram 500 shows illustrative experimental results for two-dimensional manipulation of particles that may be performed using the system 100. Image 502 shows particles 504 that are trapped in acoustic wells defined in the acoustic potential field 114. Illustratively, the particles 504 are 2 μm fluorescent polystyrene particles. As shown in the image 502, the particles 504 are trapped in acoustic wells with equal trapping spacing, with each well separated by a distance 506, which is illustratively about 30 μm. The spacing between trapping wells can be tuned by modifying parameters of the harmonic components as described above. Image 502' shows the particles 504 trapped in a modified acoustic potential field 114'. As shown, there is a tuneable distance between trapping wells, with certain trapping wells separated by distance 508 and other wells separated by a trapping distance 510. Illustratively, the distance 510 is 1.5 times the distance 508 (e.g., about 45 μm and about 30 μm, respectively). The distances between trapping wells is tuneable and may be varied over time by varying the harmonic components of the harmonic signals used to drive the IDTs 104.

Figure 6:
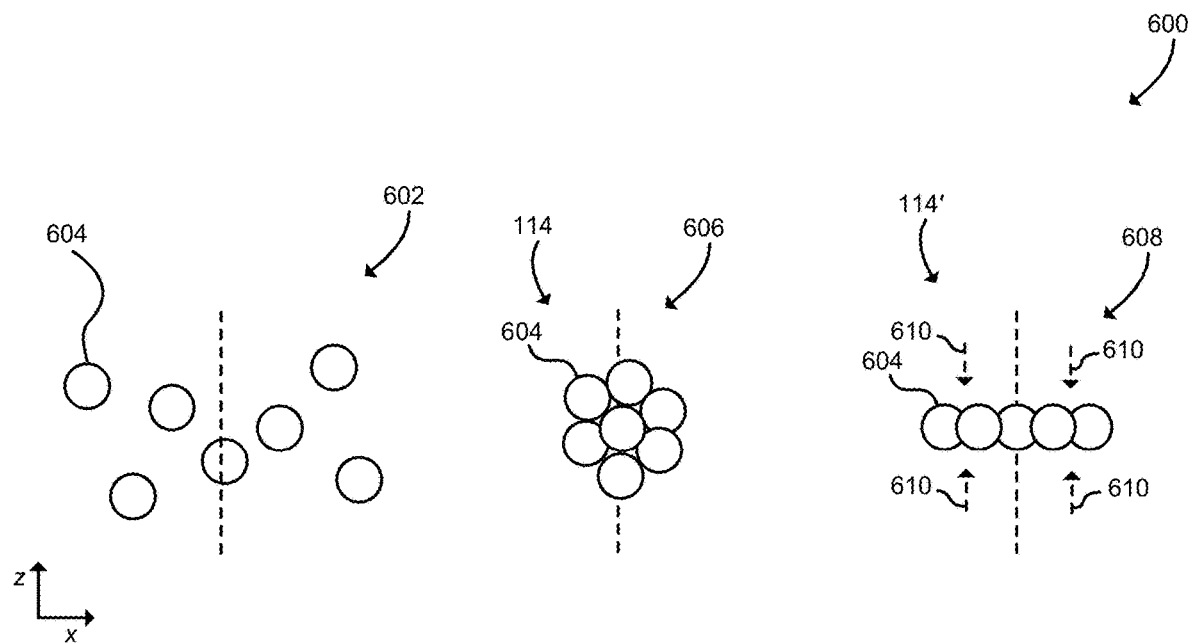
FIGS. 6 and 7 are schematic illustrations of experimental results that may be achieved for colloidal crystal monolayer manipulation of particles using the system of FIGS. 1-2 and the method of FIG. 3.
Figure 7:
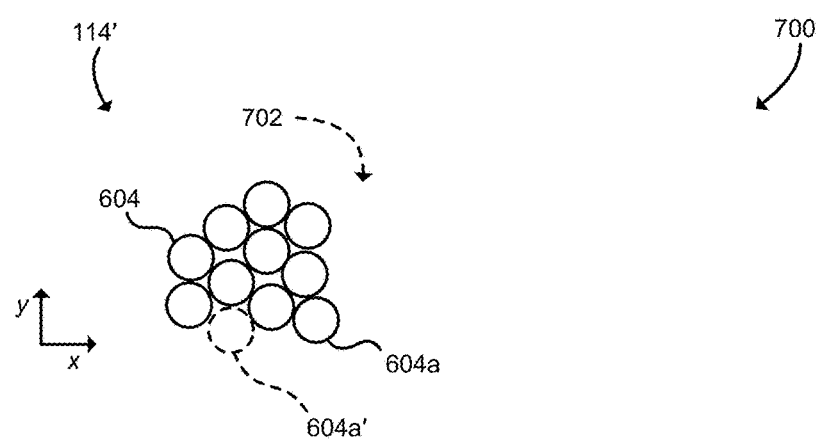

Referring now to FIGS. 6 and 7, diagrams 600, 700 shows illustrative experimental results for colloidal crystal monolayer manipulation of particles that may be performed using the system 100. As shown in subdiagram 602 of the diagram 600, initially a group of particles 604 are randomly distributed throughout the fluid layer 104. The particles 604 may be cells or other colloidal particles. As shown in subdiagram 606, after application of an acoustic field potential 114, the particles 604 form clumps at locations of trapping wells. The illustrative acoustic field potential 114 may be formed by standing SAWs in the x- and y-directions on the substrate 102. Subdiagram 608 shows the particles 604 after applying a modified acoustic field potential 114' generated using harmonic SAWs as described above. As shown, the acoustic field potential 114' generates focusing forces 610 in the z-direction, which moves the particles 604 into a crystalline monolayer. As shown in the diagram 700 of FIG. 7, when the modified acoustic field potential 114' is applied, the particles 604 are arranged in a compact crystalline structure. This crystalline structure spins in the x-y plane about an axis that lies in the z-direction, as shown by the arrow of rotation 702. The direction and speed of the rotation may be controlled by modifying the phase difference of the harmonic signals. Additionally, particles 604 may move into compact crystalline positions as the colloidal crystal structure rotates. For example, particle 604a may move to a final position, illustrated in phantom as particle 604a'. Spin speed may also depend on other factors, such as the configuration of particles 604 in each colloidal crystal monolayer and/or the number of particles 604 in each colloidal crystal monolayer.

Figure 8:
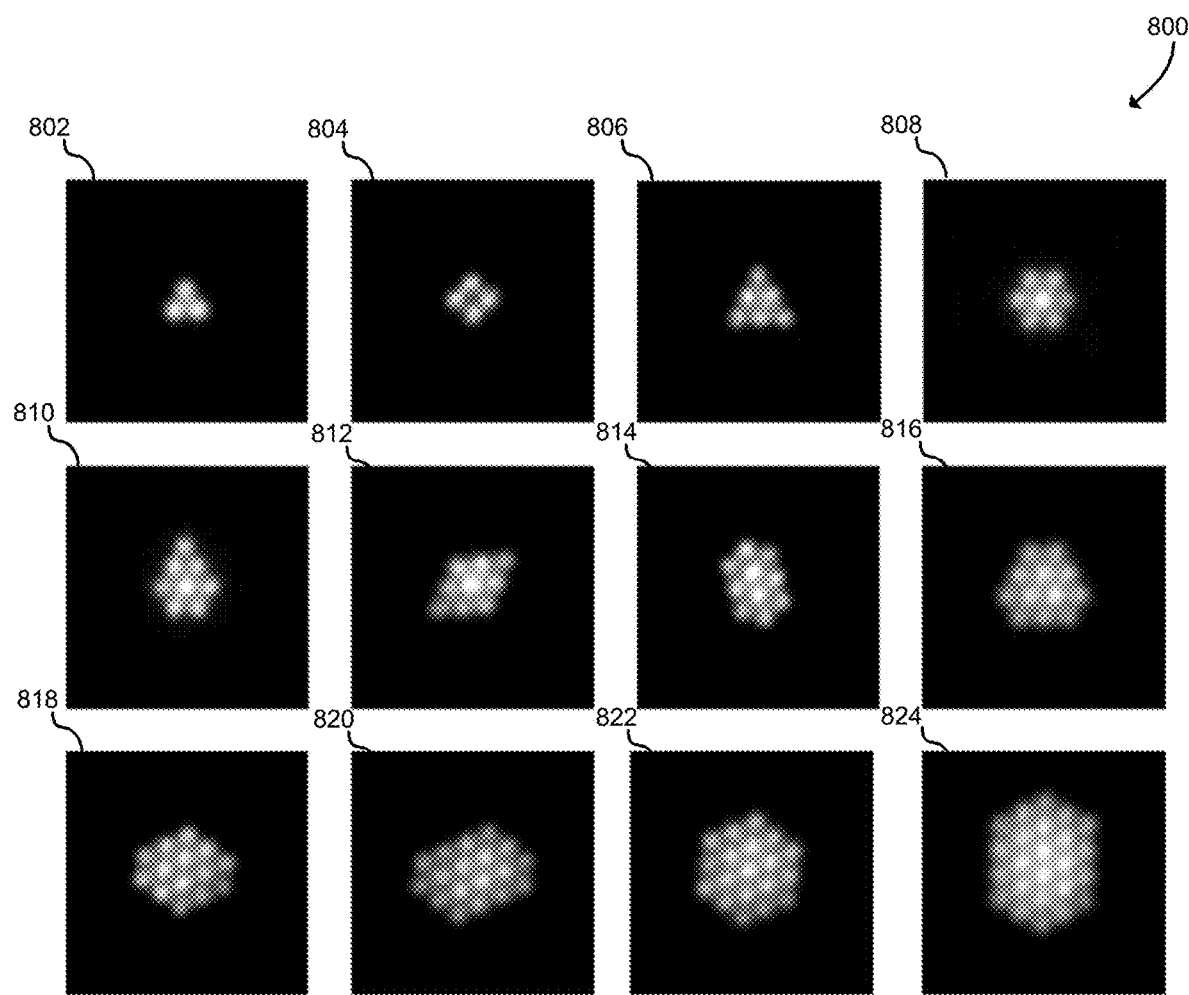
FIG. 8 is an illustration of experimental results that may be achieved for colloidal crystal monolayer manipulation of particles using the system of FIGS. 1-2 and the method of FIG. 3.

Referring now to FIG. 8, diagram 800 shows additional illustrative experimental results for colloidal crystal monolayer manipulation of particles that may be performed using the system 100. The diagram 800 shows imaging results for experiments performed using fluorescent polystyrene particles having a diameter of 2 μm. As shown, crystals with multiple different particle numbers and shapes may be formed. For example, image 802 shows a crystal with particle number equal to three, image 804 shows a crystal with particle number equal to four, image 806 shows a crystal with particle number equal to six, image 808 shows a crystal with particle number equal to seven, image 810 shows a crystal with particle number equal to eight, image 812 shows a crystal with particle number equal to nine, image 814 shows a crystal with particle number equal to 10, image 816 shows a crystal with particle number equal to 12, image 818 shows a crystal with particle number equal to 14, image 820 shows a crystal with particle number equal to 18, image 822 shows a crystal with particle number equal to 19, and image 824 shows a crystal with particle number equal to 24.

By tuning the frequencies and amplitudes of five-component harmonic SAWs (such as $f_2$ to $f_6$), the shapes and sizes of the harmonic acoustic wells can be modulated, which enables the generation of diverse crystal monolayers with different numbers of particles. Due to the secondary acoustic radiation forces generated by the scattering of the acoustic field between the particles, the monolayer assemblies can be stabilized as close-packed colloidal crystals. Manipulation as described herein can also spin the entire colloidal crystal assembly by applying a phase difference ($\Delta\varphi=\varphi x-\varphi y$) between the x and y direction harmonic SAWs. This acoustic-induced rotation allows creation of various colloidal crystals from the initial cluster by further shaping the colloidal assemblies with the stabilized monolayer patterns. Additionally, the rotational direction of an assembly can be easily tuned by changing the phase difference of the applied harmonic SAWs. For example, a positive phase difference ($\Delta\varphi>0$) may result in a clockwise rotation and a negative phase difference ($\Delta\varphi<0$) may result in a counter-clockwise rotation for a ten-particle cluster monolayer. After the further quantitative study, it has been demonstrated that the rotational speed of the colloidal assembly is linear with respect to the phase difference, and this speed can be proportionally tuned by varying the amplitudes of the applied excitations.

Additionally, spin speed of the colloidal monolayers with different numbers of particles (from n=2 to n=10) and configurations (four monolayer configurations with n=6) was investigated. Under the same excitation, it was observed that the spin speed of the assemblies is strongly correlated with the colloidal crystal configurations rather than with the particle numbers. For example, for certain investigated configurations of six-particle clusters, the highest spin speed is achieved by a flower-shaped arrangement with the rotational symmetry of order five. This observation suggests that clusters with higher orders of rotational symmetry tend to have a faster spin speed. It also demonstrates the capability of manipulation by the system 100 for different crystal configurations of the colloidal crystal monolayer by varying the spin speeds. With this capability for precise particle assembly, the system 100 may be used to explore the fundamental soft condensed-matter physics behind colloidal interactions and assembly.

Figure 9:
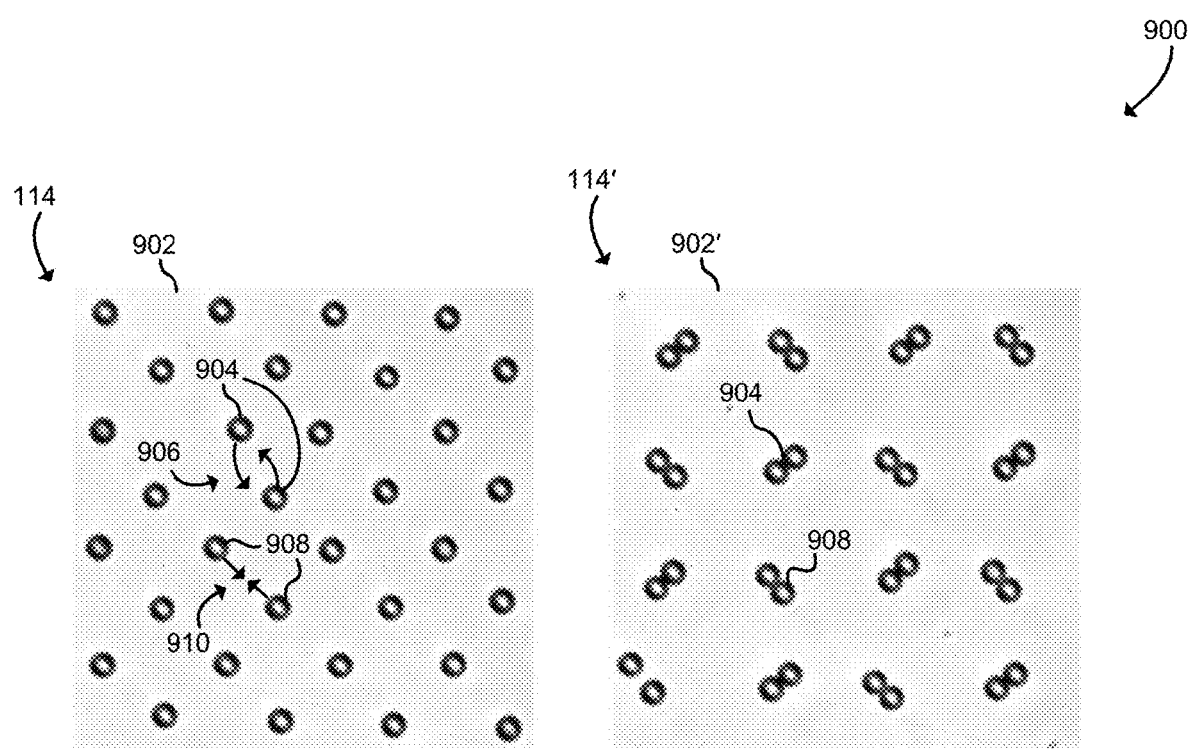
FIG. 9 is an illustration of experimental results that may be achieved for high-throughput particle combination and separation using the system of FIGS. 1-2 and the method of FIG. 3.

Referring now to FIG. 9, diagram 900 shows illustrative experimental results that may be achieved for high-throughput particle combination and separation. Image 902 shows multiple colloidal particles trapped in an acoustic potential field 114. The illustrative particles may be cells or other colloidal particles having a diameter of 9.51 μm. Each particle may be trapped in an acoustic well, and the wells may be isolated from each other or connected in a mesh-like arrangement. As described above, the acoustic potential field can be actively controlled in order to manipulate the particles. For example, by switching from second harmonic (80 MHz) to base (40 MHz) frequencies, the acoustic potential field pattern 114 may be reconfigured from single-colloid trapping to pair trapping. As another example, by using harmonics (39.8 MHz) in one direction that are slightly shifted from harmonics (40 MHz) in the orthogonal direction, the acoustic field pattern 114 can form a uniform rectangular pattern that enables repeatable switching between trapping of a single colloid and pairing colloids. The diagram 900 illustrates such pairing. For example, as the acoustic potential field changes, particles 904 may experience forces 906 causing the particles 904 to form a pair. Similarly, particles 908 may also experience forces 910 causing the particles 908 to form a pair. Image 902' shows the particles 904, 908 after pairs have been formed. As shown, the particles may be paired with particles from different directly. Those pairs may be separated by reversing the direction of the change in acoustic potential field. Accordingly, the system 100 may reversibly pair and/or separate colloids with high throughput (e.g., more than 100 simultaneous pairs).

Thus, the distance between individual colloids or cells can be dynamically modulated with subwavelength manipulation resolution. This subwavelength manipulation resolution is achieved with a time-effective Fourier-synthesized acoustic potential field that was realized by sequentially applying nanosecond pulsing of SAWs with a time-division multiplexing method during a period T By modulating the time-division $\Delta t1$, $\Delta t2$ and their ratio κ, spectrum trapping occurs and enables positional tuning to precisely manipulate objects in a half-wavelength range of applied SAWs. On the basis of analytical simulations, this spectrum trapping method can provide spatial control with nanometer precision. By shaping the acoustic potential field on demand, the configuration of an acoustic-well array can be actively controlled. For example, a mesh-like arrangement of connected acoustic wells can be generated by using the same frequency to excite standing SAWs in the x and y directions. By switching from the second harmonic ($f^x_2 = f^y_2 = 80.0$ MHz) to base ($f^x_1 = f^y_1 = 40.0$ MHz) frequencies, the lattice constant of the acoustic-well array changed from $(\sqrt{2}/4)\lambda_1$ to $(\sqrt{2}/2)\lambda_1$, causing the reconfiguration of the pattern from single-colloid trapping to pair. Specifically, at higher harmonics, each colloid occupies an acoustic well. However, the number of acoustic wells is reduced with a decrease in frequency, which forces the colloids to settle the same acoustic well at lower harmonics. When using harmonics ($f^x_1 = 39.8$ MHz) in the x direction that are slightly shifted from the harmonics ($f^y_1 = 40.0$ MHz) in the y direction, a dot-like array of isolated acoustic wells can form a uniform rectangular pattern that enables repeatable switching between trapping of a single colloid and pairing. Notably, via dynamic switching among nanosecond pulsing harmonics, a time-effective Fourier-synthesized acoustic potential field can be formed. Furthermore, the generated harmonic acoustic wells can be programmed with tunable sizes and spacings between neighboring wells. To demonstrate the dynamic patterning capability of the system 100, customized colloid patterns were created that form the shapes of the letters, 'O,' 'D,' and 'K', respectively, via modulating the five-component harmonic SAWs, as described further below in connection with FIG. 11.

By dynamically and reversibly switching between the single-colloid trapping and pairing modes, repeatable (operating for more than 1,000 pairing cycles) and high-throughput (>100 pairs simultaneously) studies can be performed. The separation force during this reversible pairing process was characterized for polystyrene particles with an average diameter of 9.51 μm. The force—time curves were experimentally measured, and the peak separation force was calculated to range from 1.6 to 19.5 pN with variable excitation amplitudes. Note that the separation force scales with the square of the SAW excitation amplitudes. The separation force applied on cells can also be calculated. The time for particles to be fully separated was approximately 12 ms when using an 8 V SAW excitation signal. Combining this short exposure time with the piconewton separation forces decreases the likelihood that this acoustic manipulation method would interfere with cell sample measurements.

Additionally, selective manipulation for single cell—cell pairings was investigated. Individual U937 cells (marked with different colours) were trapped in four adjacent acoustic wells. By switching the frequency of the harmonic standing SAWs between 39.8 and 79.6 MHz in the x direction, while keeping the frequency constant at 40.0 MHz in the y direction, two pairs of U937 cells can be periodically brought into contact and then separated in the x direction. To perform reversible cell—cell pairing in the y direction, swapped the applied excitations may be swapped in the x and y directions. It was demonstrated that each cell could be paired with cells from different directions. Furthermore, U937 cells can be selectively paired while keeping neighboring cells intact by modulating the synthesized six-component harmonic SAWs. In summary, the system 100 can reversibly pair cells in a high-throughput manner and can also selectively target any two neighboring cells by modifying the applied multi-harmonic waves.

Figure 10:
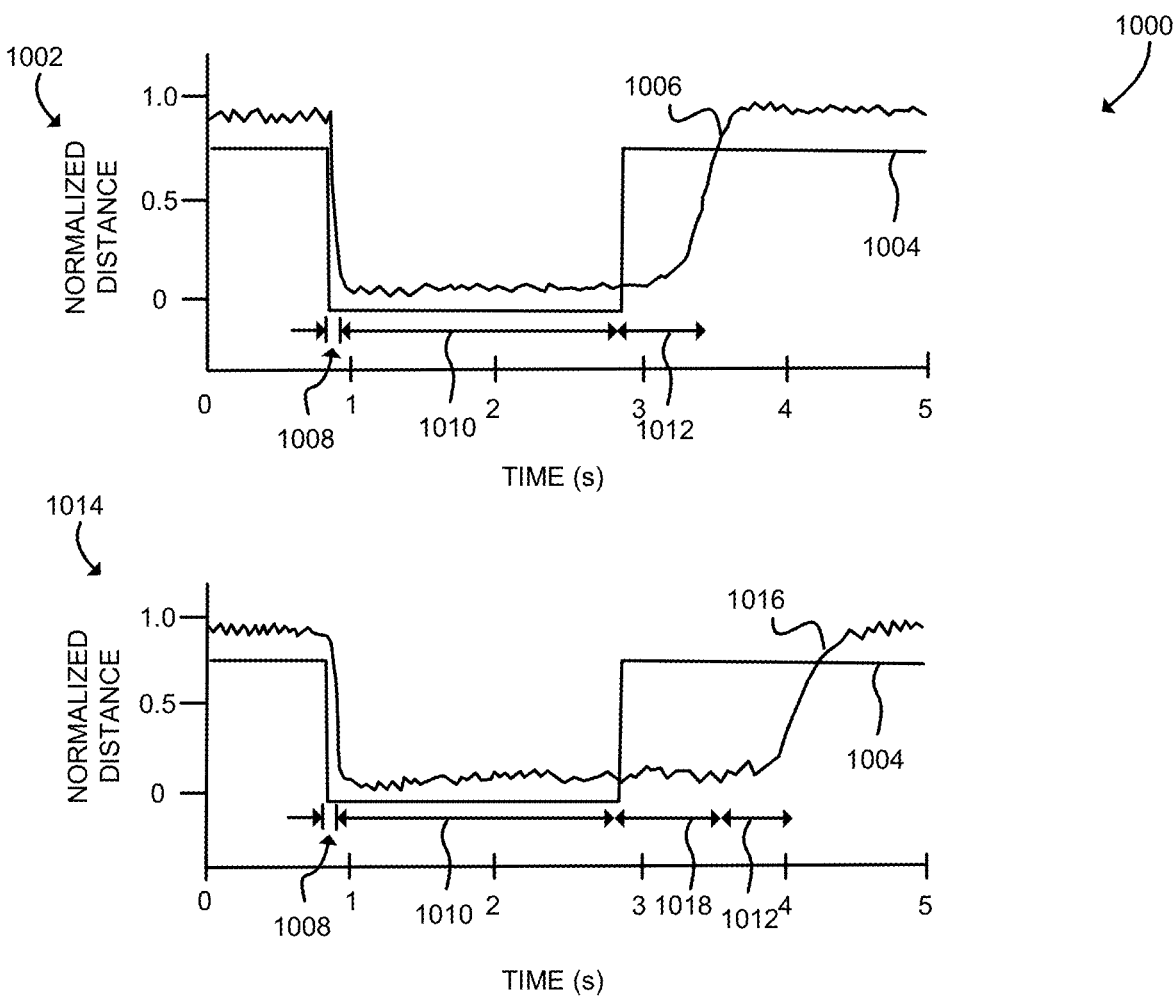
FIG. 10 is an illustration of experimental results that may be achieved for measuring adhesion strength for combined particles using the system of FIGS. 1-2 and the method of FIG. 3.

Referring now to FIG. 10, diagram 1000 shows illustrative experimental results that may be achieved for measuring adhesion strength for combined particles. In the experiment, cells were repeatedly paired and separated using similar techniques as described above. Chart 1002 illustrates results for an experiment using M0 THP-1 cells. Curve 1004 represents the acoustic potential field 114. When the curve 1104 is at the low value, the acoustic potential field 114 forces the cells to pair, and when the curve 1104 is at the high value, the acoustic potential field 114 forces the cells to separate. Curve 1006 illustrates normalized distance between pairs of cells. As shown, the curve 1006 can be separated into three phases 1008, 1010, 1012. In the phase 1008, the paired cells approach each other, in the phase 1010 the cells contact each other, and in the phase 1012 the cells retract from each other.

Chart 1014 illustrates results for another experiment using M1 THP-1 cells. Curve 1004 represents the acoustic potential field 114, similar to the chart 1002. Curve 1016 illustrates normalized distance between pairs of cells. As shown, the curve 1016 can be separated into four phases 1008, 1010, 1018, 1012. In the phase 1008, the paired cells approach each other, in the phase 1010 the cells contact each other, in the phase 1018 the cells adhere to each other, and in the phase 1012 the cells retract from each other. As shown, the M0 THP-1 cells are non-adherent, and the M1 THP-1 cells are adherent. The length of the phase 1018, or the adhesion lifetime, may depend on the balance between separate force caused by the acoustic potential field 114 and adhesion force between the cells. Accordingly, the system 100 is capable of measuring and distinguishing adhesion differences between adherent and non-adherent cells. Similarly, the system 100 may measure adhesion differences caused by drug treatments or other treatments of the cells. As another example, the system 100 may distinguish between groups of cells or cell lines. For example, the system 100 may use measured adhesion strength to distinguish and/or identify metastatic cancer cells as compared to other cells.

The ability to distinguish variations in cell-cell adhesion is a significant quantitative capability for any single-cell manipulation and analysis technique. Typical techniques, such as atomic force microscopy, micropipette aspiration and optical tweezers, may require direct physical contact with the cells. Additionally, these techniques can typically only probe one cell pair each time, which is time-consuming and labor-intensive for any practical assay. With the ability to simultaneously perform repeated and reversible cell-cell pairing in a large array in suspension as described above, cell-cell adhesion assays were conducted with the system 100 on various cell lines. As described above, it was investigated whether the system 100 could distinguish adhesion differences between adherent THP-1 macrophages (M1 THP-1) and non-adherent THP-1 monocytes (M0 THP-1). Here, THP-1 macrophages are differentiated from THP-1 monocytes with phorbol-12-myristate-13-acetate (PMA) as a stimulus. As shown in FIG. 10, non-adherent M0 THP-1 cells begin their retraction period immediately after a 2 s contact signal is deactivated, since their intrinsic adhesion forces are not adequate to balance the acoustic separation forces. Conversely, M1 THP-1 cells cannot be immediately separated due to the significantly increased adherence with the PMA stimulation. The cell-cell distance trace for M1 THP-1 cells is a flat line for the period immediately after contact signal deactivation. This is due to the force clamp (the balance between the separation force and the adhesion force), and the duration of this force clamp period is defined as the adhesion lifetime ($t_1$). Using this value, differences in adhesion forces between cell types can be distinguished consistently and quantitatively. Additionally, the applied contact signal duration $t_{cs}$ was varied (0.5-2.5 s) to investigate variations in adhesion lifetimes. For example, both heatmaps of the adhesion lifetimes and histograms of the adhesion frequency (defined here as the percentage of adhesion lifetime events per cell pair for 50 contact and separation cycles) present that the adhesion strength of M1 THP-1 cells increased with the duration of the applied contact signal. A western blot analysis with a high expression of the intercellular adhesion molecule ICAM-1 confirmed that there should be a higher cell-cell adhesion strength in the M1 THP-1 cells than that in the M0 THP-1 cells. Altogether, these results support that the system 100 can successfully measure and distinguish adhesion differences between adherent and non-adherent cells.

In addition to cell surface proteins, cell-cell adhesion strength could also be affected by other intrinsic properties of cells, such as the actin cytoskeleton organization. Thus, the system 100 was applied to examine and quantify the variation of cell-cell adhesion strength caused by perturbations in the organization of the actin cytoskeleton. Adhesion differences were explored in MCF-7 cells with and without a Cytochalasin D (CytoD) treatment. The CytoD treatment affects the organization of the cytoskeletal network and inhibits actin polymerization in cells. Previous experiments have demonstrated that actin polymerization regulates the rapid cell-cell adhesion during cell migration. Without the CytoD treatment (CytoD−), the histogram of the adhesion lifetimes for MCF-7 cells shows a bimodal distribution of short ($t_{short}$) and long ($t_{long}$) lifetimes with average values of 0.30±0.15 and 0.82±0.15 s, respectively, as determined by a Gaussian fit. In sharp contrast, CytoD+ MCF-7 cells had a lower fraction (34.2 versus 62.3%) of long lifetimes than CytoD− MCF-7 cells, which indicates a reduction in adhesion strength after CytoD treatment.

Since intercellular adhesion forces are critical information about cell—cell attachment and detachment, the capability of the system 100 to quantify the variations in cell adhesion forces among different cell lines (Supplementary FIG. 5i) was investigated. MDA-MB-231 and human embryonic kidney 293T (HEK293T) cells were tested following the same protocol as used with the MCF-7 cells. Compared with CytoD− MCF-7 cells, MDA-MB-231 cells show a lower fraction (41.5 versus 62.3%) of long adhesion lifetimes, which suggests a lower cell adhesion than CytoD− MCF-7 cells. Additionally, the adhesion lifetimes of HEK293T cells show an almost equally populated bimodal distribution with similar short (46.4%) and long (53.6%) lifetime subpopulations. For each cell line tested above, the bimodal Gaussian distribution in the lifetime enables a detailed comparison of the fractions of short and long lifetimes. The adherent cells may be compared on the basis of their fractions of lifetime subpopulations, and the average lifetime fraction ratio RL/S (the ratio of the long lifetime fraction to the short lifetime fraction) may be calculated for each cell type. This average lifetime fraction ratio could be used as an indicator for indirectly measuring the differences in cell—cell adhesion behavior and strength. Notably, the adhesion strength decreased (as indicated by RL/S decreasing from 1.65 to 0.71) as the metastatic potential increased for the human breast cancer cell lines from MCF-7 to MDA-MB-231, which is consistent with measurements taken by micropipette aspiration and static methods.

Figure 11:
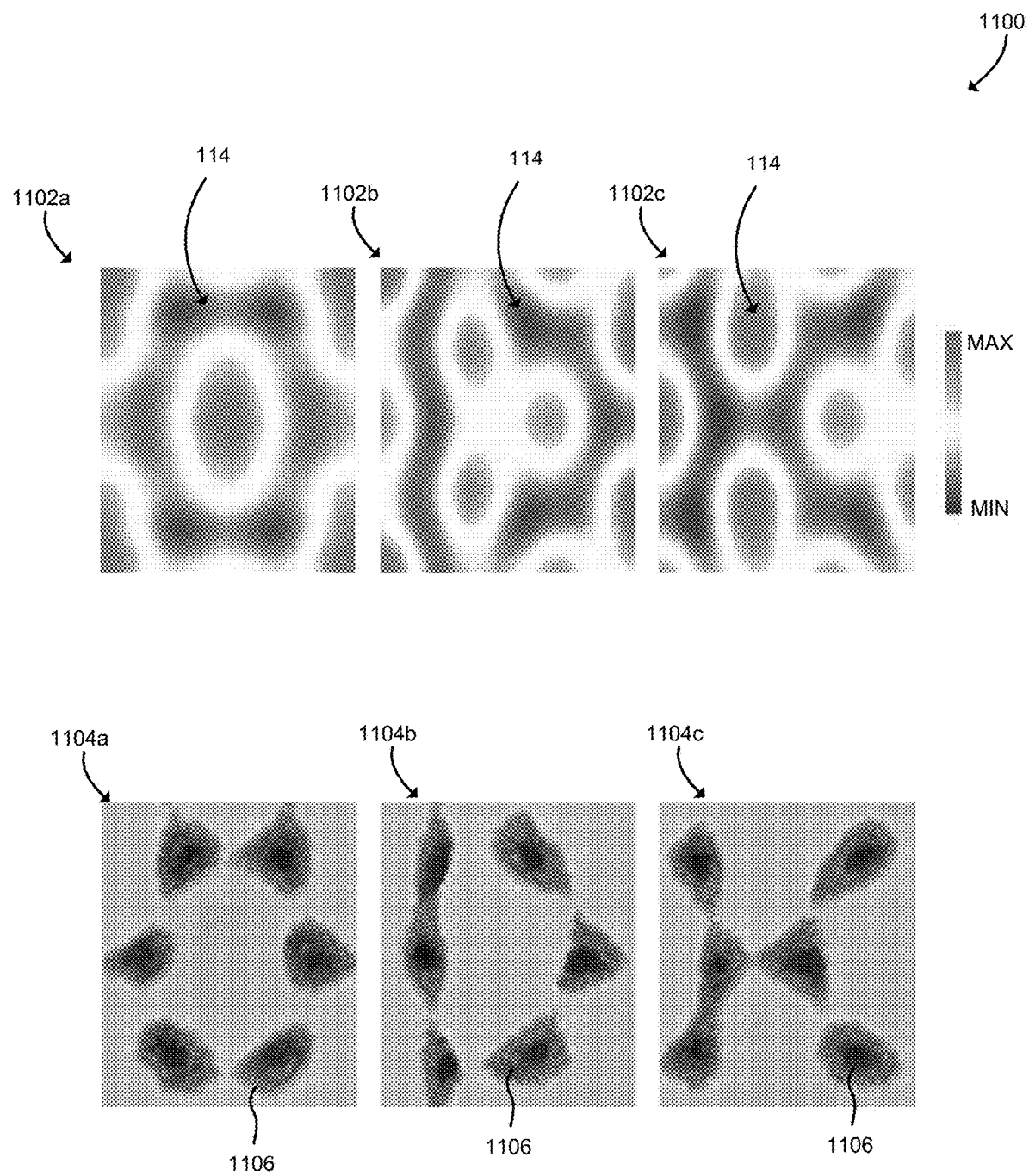
FIG. 11 is an illustration of experimental results that may be achieved for patterning a surface with particles using the system of FIGS. 1-2 and the method of FIG. 3.

Referring now to FIG. 11, diagram 1100 shows illustrative experimental results that may be achieved for patterning a surface with particles using the system 100. Images 1102a, 1102b, 1102c illustrate predicted acoustic potential fields 114 associated with particular harmonic signals. Illustratively, the harmonic signals are synthesized to create acoustic potential fields 114 having shapes corresponding to the letters "O", "D," and "K," respectively. Images 1104a, 1104b, 1104c illustrate particles 1106 that have been arranged on the substrate 102 by application of the acoustic potential fields 114 as described above. Illustratively, the particles 1106 are 2 μm polystyrene particles.

Figure 12:
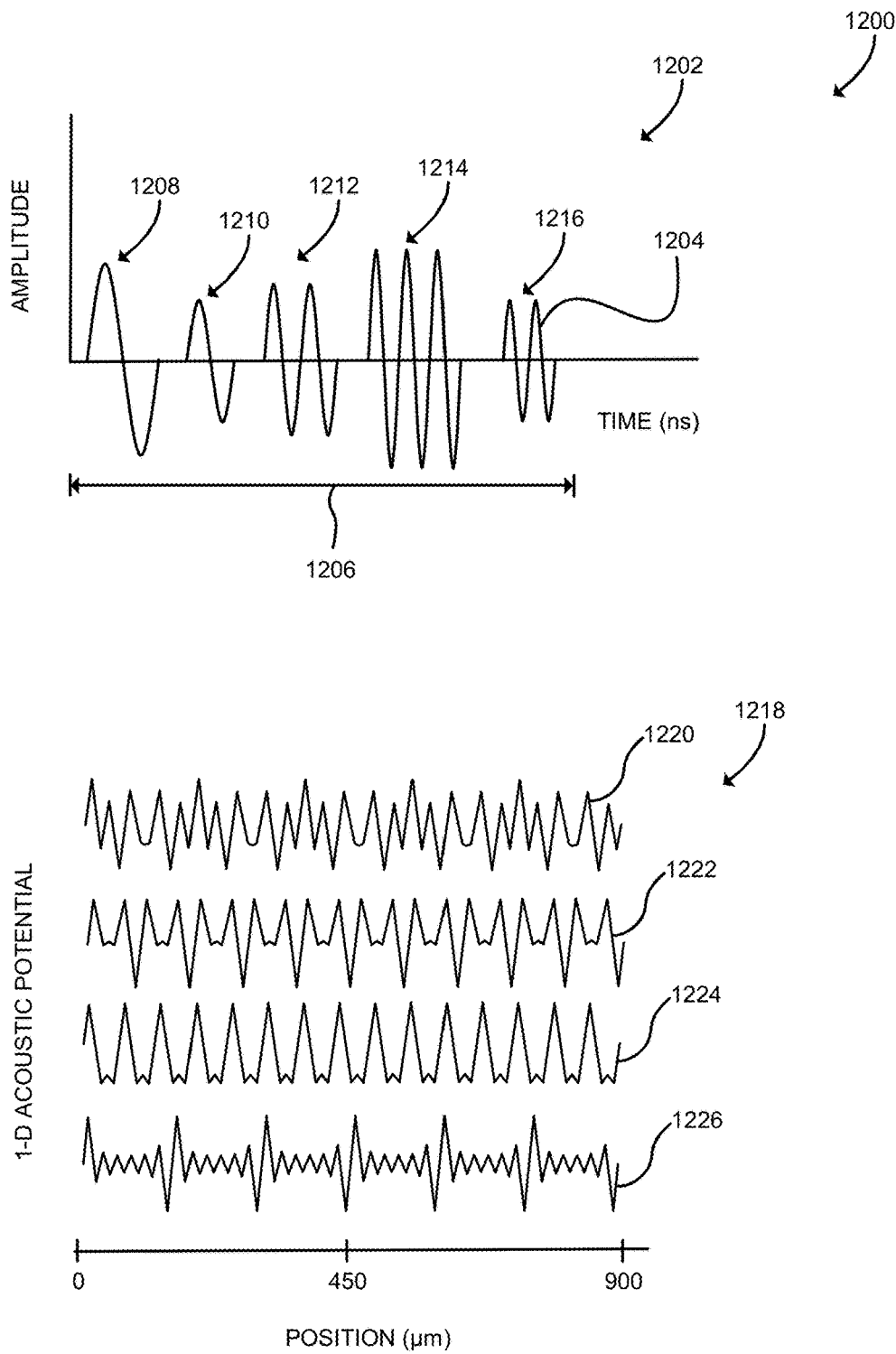
FIG. 12 is a diagram of simplified charts illustrating harmonic components and generated harmonic waves that may be used with the system of FIGS. 1-2 and the method of FIG. 3.

Referring now to FIG. 12, diagram 1200 illustrates harmonic components and harmonic signals that may be generated by the system 100. Chart 1202 illustrates one potential embodiment of a time-division multiplexed harmonic signal that may be generated by the controller 110 and applied to one or more segmented IDTs 104. Curve 1204 represents amplitude of the electrical signal that maybe applied to the IDTs 104. The curve 1204 includes a time division 1206, which is a relatively short duration of nanosecond scale. The time division 1206 is further subdivided into harmonic components 1208, 1210, 1212, 1214, 1216 as described above. As shown, each harmonic component has as different harmonic frequency and has a particular amplitude as determined by the controller 110. Each harmonic component may also have other varying parameters such as pulse width, phase, or other tonal parameters. The harmonic signal applied to the IDTs 104 includes repeated time divisions 1206.

Chart 1218 illustrates example one-dimensional acoustic potential fields 114 that may be generated by the system 100 based on time-division multiplexed signals similar to those shown in the chart 1202. In particular, curve 1220 represents an acoustic potential field that may be generated for the signal 1204 shown in the chart 1202. The curve 1220 may correspond to an acoustic potential field for two-dimensional colloidal crystal monolayer generation as described above. Similarly, curve 1222 may correspond to an acoustic potential field for patterning particles as described above. Curve 1224 may correspond to an acoustic potential field for high-throughput particle pairing and separation as described above. Curve 1226 may correspond to an acoustic potential field for selective particle pairing and separation as described above.

The invention claimed is:

1. A method for harmonic acoustic manipulation of particles, the method comprising:
   introducing particles into a fluid positioned over a first surface of a piezoelectric substrate;
   generating a first harmonic signal comprising a plurality of harmonic components; and
   applying the first harmonic signal to a first harmonic acoustic transducer, wherein the first harmonic acoustic transducer is coupled to the first surface of the piezoelectric substrate and spaced apart from the fluid.

2. The method of claim 1, wherein the particles are cells, colloids, extracellular vesicles, or particles with a corresponding diameter between 1 nm and 1 cm.

3. The method of claim 1, further comprising varying a parameter of one or more harmonic components of the plurality of harmonic components after introducing the particles into the fluid.

4. The method of claim 3, wherein the parameter comprises a frequency, an amplitude, or a phase.

5. The method of claim 3, further comprising manipulating a single particle or a group of particles within the fluid by varying the parameter of the one or more harmonic components.

6. The method of claim 5, wherein manipulating the particles comprises translating a particle or a group of particles.

7. The method of claim 5, wherein manipulating the particles further comprises rotating a particle or a group of particles.

8. The method of claim 5, wherein manipulating the particles further comprises causing a plurality of particles to combine by reducing a distance between a corresponding acoustic trapping wells generated by the first harmonic signal.

9. The method of claim 8, wherein manipulating the particles further comprises causing the plurality of particles to separate by increasing the distance between the corresponding pair of acoustic trapping wells generated by the first harmonic signal.

10. The method of claim 5, wherein manipulating the particles further comprises measuring adhesion strength of a plurality of particles.

11. The method of claim 5, wherein manipulating the particles further comprises selectively manipulating target particles while keeping other particles intact.

12. The method of claim 5, wherein manipulating the particles further comprises changing a distance between a plurality of acoustic trapping wells generated by the first harmonic signal.

13. The method of claim 1, wherein applying the first harmonic signal comprises applying the signal with time-division multiplexing, wherein time-division multiplexing comprises, for each time division of the first harmonic signal, applying a signal with an excitation frequency corresponding to a resonant frequency of a segment of the first harmonic acoustic transducer.

14. The method of claim 1, wherein the piezoelectric substrate comprises lithium niobate, lithium tantalite, gallium arsenide, aluminum nitride, zinc oxide, lead zirconate titanate, or quartz.

15. The method of claim 1, wherein the first harmonic signal has a fundamental frequency between 20 KHz and 10 GHz.

16. A system for harmonic acoustic manipulation, the system comprising:
a piezoelectric substrate having a first surface; and
a segmented acoustic transducer coupled to the first surface of the piezoelectric substrate, the segmented acoustic transducer comprising a plurality of segments including a first segment and a second segment, wherein the first segment has a first resonant frequency and the second segment has a second resonant frequency, wherein the second resonant frequency is an integer multiple of the first resonant frequency.

17. The system of claim 16, wherein each segment of the plurality of segments comprises a plurality of interdigital fingers separated by a finger pitch distance, wherein the first segment has a first finger pitch distance and the second segment has a second finger pitch distance, wherein the first finger pitch distance is the integer multiple of the second finger pitch distance.

18. The system of claim 17, wherein:
the first finger pitch distance is twice the second finger pitch distance; and
the second resonant frequency is twice the first resonant frequency.

19. The system of claim 16, further comprising:
a first pair of segmented acoustic transducers coupled to the first surface of the piezoelectric substrate, the first pair including the segmented acoustic transducer; and
a second pair of segmented acoustic transducers orthogonal coupled to the first surface of the piezoelectric substrate and orthogonal to the first pair.

20. The system of claim 16, further comprising a controller configured to:
generate a first harmonic signal comprising a plurality of harmonic components, wherein each of the harmonic components has a frequency that corresponds to the resonant frequency of a segment of the segmented acoustic transducer; and
apply the first harmonic signal to the segmented acoustic transducer.

* * * * *